(12) United States Patent
Inoue et al.

(10) Patent No.: US 7,482,647 B2
(45) Date of Patent: Jan. 27, 2009

(54) SEMICONDUCTOR DEVICE

(75) Inventors: Susumu Inoue, Chino (JP); Yo Takeda, Sakata (JP); Yutaka Maruo, Sakata (JP)

(73) Assignee: Seiko Epson Corporation (JP)

(*) Notice: Subject to any disclaimer, the term of this patent is extended or adjusted under 35 U.S.C. 154(b) by 42 days.

(21) Appl. No.: 11/768,514

(22) Filed: Jun. 26, 2007

(65) Prior Publication Data
US 2007/0246759 A1  Oct. 25, 2007

Related U.S. Application Data

(62) Division of application No. 11/249,253, filed on Oct. 13, 2005, now Pat. No. 7,253,462.

(30) Foreign Application Priority Data

Dec. 21, 2004 (JP) ............................. 2004-369587

(51) Int. Cl.
    *H01L 31/113* (2006.01)
(52) U.S. Cl. .................. 257/294; 257/659; 257/660; 257/E31.122
(58) Field of Classification Search ............ 257/294, 257/659, 660, E31.122
    See application file for complete search history.

(56) References Cited

U.S. PATENT DOCUMENTS

| | | | |
|---|---|---|---|
| 6,266,110 B1 | 7/2001 | Mizuno | |
| 6,417,560 B1* | 7/2002 | Okawa et al. | 257/659 |
| 6,704,068 B2 | 3/2004 | Murade | |
| 6,717,633 B2* | 4/2004 | Murade | 349/44 |
| 6,998,299 B2 | 2/2006 | Shibata | |
| 7,126,175 B2 | 10/2006 | Inoue | |
| 2004/0132262 A1 | 7/2004 | Ayabe | |
| 2004/0189625 A1* | 9/2004 | Sato | 345/204 |
| 2007/0035686 A1* | 2/2007 | Iwakabe et al. | 349/141 |

FOREIGN PATENT DOCUMENTS

| | | |
|---|---|---|
| JP | 61-129875 | 6/1986 |
| JP | 63-308388 | 12/1988 |
| JP | 63-310180 | 12/1988 |
| JP | 2003-124363 | 4/2003 |

* cited by examiner

*Primary Examiner*—Trung Dang
(74) *Attorney, Agent, or Firm*—Harness, Dickey & Pierce, P.L.C.

(57) ABSTRACT

A semiconductor device includes a semiconductor element that is set up on a semiconductor layer, a light shielding wall that is set up around the semiconductor element, a hole that is set up on the light shielding wall, and a wiring layer that is electrically connected to the semiconductor element and is drawn out through the hole to the outside of the light shielding wall. The wiring layer has a pattern including a first part that is located within the hole and a second part that is located on the outside of the hole and has a larger width compared to the width of the first part, the width of the second part being the same with or larger than the width of the hole.

35 Claims, 8 Drawing Sheets

(A)

(B)

(A)

(B)

(C)

(A)

(B)

(C)

(A)

(B)

SEMICONDUCTOR DEVICE

RELATED APPLICATIONS

This application is a divisional patent application of U.S. Ser. No. 11/249,253 filed Oct. 13, 2005 now U.S. Pat. No. 7,253,462 and claims priority to Japanese Patent Application No. 2004-369587 filed Dec. 21, 2004 which is hereby expressly incorporated by reference herein in its entirety.

BACKGROUND

1. Technical Field

The present invention relates to a semiconductor device that includes a semiconductor element the properties of which can change in response to light.

2. Related Art

As semiconductor elements the properties of which change in response to light, there are a MOS transistor, a nonvolatile memory having a floating gate electrode, and the like. These semiconductor elements, especially when mounted by using COG mounting methods, such as bear chip mounting, receive light, causing fluctuation of an on/off property in the case of a MOS transistor or causing escape of electron infused in the floating gate electrode in the case of a nonvolatile memory. For preventing the fluctuation of semiconductor element properties, a light shielding layer is set up on the area on which these devices are set up to prevent light from being irradiated.

JP-A-2003-124363 is an example of light shielding technologies. In JP-A-2003-124363, a memory cell array effective area and a light shielding area are set up in a manner that the latter surrounds the periphery of the former, with a via layer and a contact layer set up at different levels on the light shielding area. It is a technology of inhibiting entrance of light from the lateral direction and from the oblique direction by staggeredly placing the via layer and the contact layer.

However, even if a light shielding area is set up in a manner of surrounding the periphery of a memory cell array effective area so as to reduce entrance of light from the lateral direction and from the oblique direction, there are still needs, for example, to draw out a wiring, such as a signal wire, from the memory cell array effective area to the outside of the light shielding area. Therefore, there are cases where the memory cell array effective area can not be completely surrounded by the via layer and the contact layer that are set up staggeredly.

SUMMARY

An advantage of the present invention is to provide a semiconductor device that can specifically reduce entrance of light from the lateral direction and from the oblique direction for inhibiting the fluctuation of properties.

A first aspect of the invention is to provide a semiconductor device that includes a semiconductor element that is set up on a semiconductor layer, a light shielding wall that is set up around the semiconductor element, a hole that is set up on the light shielding wall, and a wiring layer that is electrically connected to the semiconductor element and is drawn out through the hole to the outside of the light shielding wall. Here, the wiring layer has a pattern including a first part that is located within the hole and a second part that is located on the outside of the hole and has a larger width compared to the width of the first part, the width of the second part being the same with or larger than the width of the hole.

In a semiconductor device according to the first aspect of the invention, entrance of light to a semiconductor element from the lateral direction and from the downward oblique direction can be reduced because a light shielding wall is set up around the semiconductor element. A wiring is connected to various kinds of semiconductor elements, and the wiring needs to be drawn out to the outside of the area that is surrounded by the light shielding wall. In that case, a hole may be set up on a part of the light shielding wall and the wiring may be drawn out to the outside through the hole, letting light enter through the hole and affect the properties of the semiconductor element. However, in a semiconductor device according to the first aspect of the invention, a wiring layer having a pattern the width of which is the same with or larger than the width of the hole is set up on the outside of the hole. Therefore, entrance of light from the lateral direction can be reduced. As a result, the fluctuation of properties is inhibited, making it possible to provide a more reliable semiconductor device.

A semiconductor device according to the first aspect of the invention can also include the following aspects.

1. In a semiconductor device according to the first aspect of the invention, the second part can be set up on a position that overlaps at least with the hole.

2. In a semiconductor device according to the first aspect of the invention, the second part can include a branching section that branches out in the crossing direction to the drawn direction.

3. In a semiconductor device according to the first aspect of the invention, the second part can be set up between the semiconductor element and the hole, and in the inside of the area surrounded by the light shielding wall.

4. In a semiconductor device according to the first aspect of the invention, the second part can be set up on the outside of the area surrounded by the light shielding wall.

5. In a semiconductor device according to the first aspect of the invention, a light shielding film that is set up over the semiconductor element can also be included.

6. In a semiconductor device according to the first aspect of the invention, the light shielding wall can include: an interlayer insulating layer that is set up over the semiconductor element, a groove that is set up on the interlayer insulating layer, and a light shielding material that is infused into the groove.

7. In a semiconductor device according to the first aspect of the invention, the semiconductor element can be a nonvolatile memory having a floating gate electrode.

8. In a semiconductor device according to the first aspect of the invention, the nonvolatile memory can be a nonvolatile memory having a single layer gate structure.

According to the aspect, a nonvolatile memory having an improved data maintenance property can be provided because entrance of light to the nonvolatile memory, which is a semiconductor element, can be reduced.

9. In a semiconductor device according to the first aspect of the invention, the wiring layer can be a signal wire.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described.

1. First Embodiment

Figure 1:
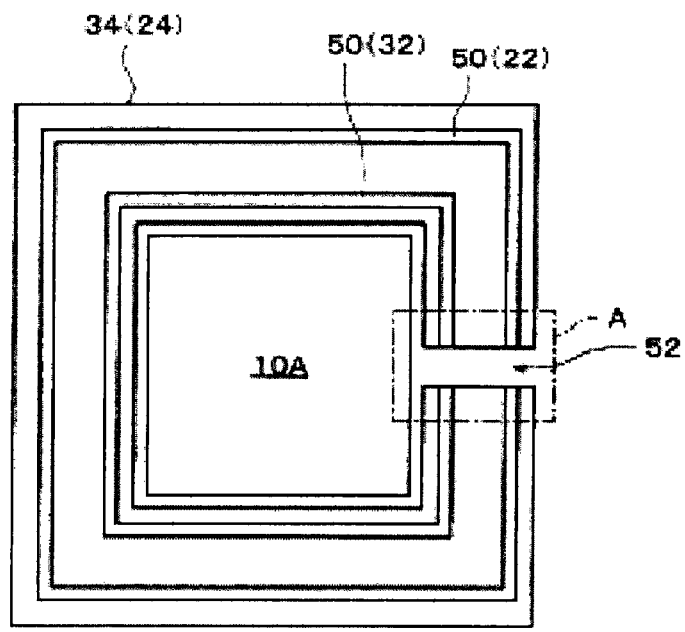
FIG. 1A is a two-dimensional pattern diagram showing a semiconductor device according to a first embodiment.
FIG. 1B is an enlarged two-dimensional diagram showing part A in FIG. 1A.
Figure 1:
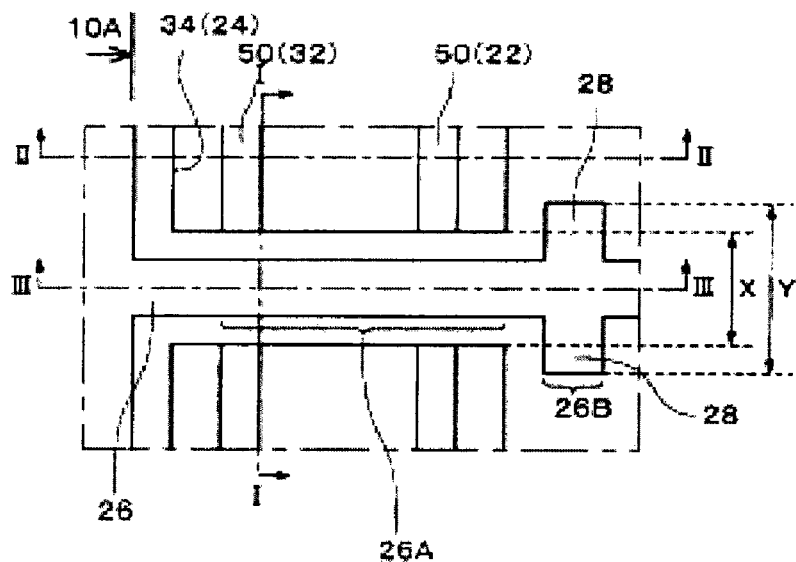
Figure 2:
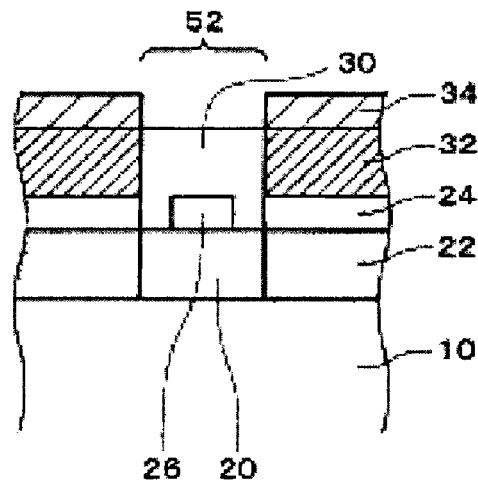
FIG. 2A is a sectional view along line I-I in FIG. 1B.
FIG. 2B is a sectional view along line II-II in FIG. 1B.
FIG. 2C is a sectional view along line III-III in FIG. 1B.
Figure 2:
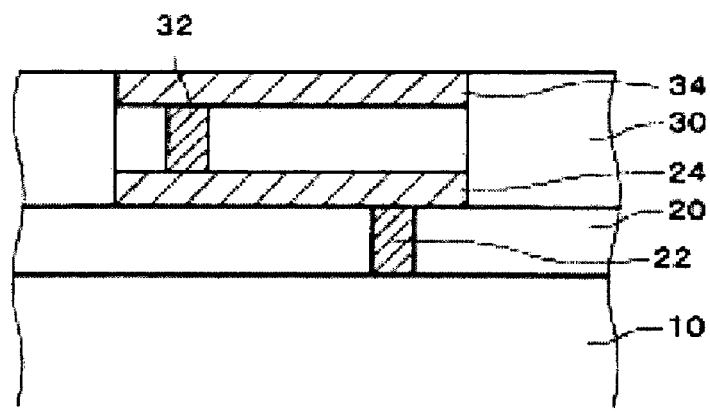
Figure 2:
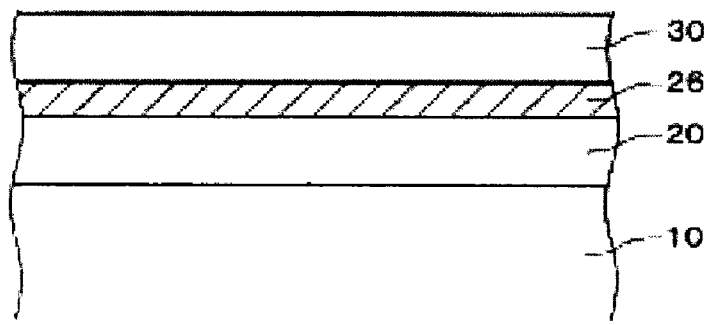

A semiconductor device of a first embodiment will be described with reference to FIGS. 1 and 2. FIG. 1A is a two-dimensional pattern diagram showing a semiconductor device according to the embodiment. FIG. 1B is an enlarged diagram showing part A in FIG. 1A. FIG. 2A is a sectional view along line I-I in FIG. 1B, FIG. 2B is a sectional view along line II-II, and FIG. 2C is a sectional view along line III-III.

As shown in FIG. 1A, a semiconductor device according to the embodiment has an element forming area 10A, on which various kinds of semiconductor elements are set up on a semiconductor layer (not shown). Elements, such as a nonvolatile memory having a floating gate electrode (including a memory cell array) and a MOS transistor, the properties of which change in response to light are set up on the element forming area 10A. A light shielding wall 50 is set up around the element forming area 10A. The light shielding wall 50 is set up so that entrance of light from the lateral direction and from the oblique direction to the element forming area 10A may be reduced. On the light shielding wall 50, there is an area where the light shielding wall 50 is not set up so as to draw out a wiring layer that is connected to the semiconductor elements on the element forming area 10A to the outside of the element forming area 10A. In the following explanation, the area where the light shielding wall 50 is not set up will be referred to as a hole 52.

Next, the explanation will be continued with reference to FIG. 1B, which is an enlarged diagram showing the area that includes the hole 52.

As shown in FIG. 1B, the wiring layer 26 is drawn out to the outside of the element forming area 10A through the hole 52. The wiring layer 26 has a pattern including a first part 26A that is located within the hole 52 and a second part 26B that is located on the outside of the hole 52 and has a larger width compared to the width of the first part 26A. In the embodiment, the case where the second part 26B is set up on the outside of the element forming area 10A as well as of the hole 52 is shown. Here, the width of the hole 52 is the distance X from one edge to the other edge of the light shielding wall 50 that bounds the hole 52. Meanwhile, the width of the wiring layer 26 is the distance Y from one edge to the other edge of the wiring layer 26 when seen from the orthogonal direction to the direction in which the wiring layer 26 is drawn out.

Specifically, in the semiconductor device according to the embodiment, the width of the second part 26B is made larger by setting up a branching section 28 in a manner of intersecting with the drawn direction of the wiring layer 26.

In this way, by setting up the branching section 28, the second part 26B is set up in a manner of overlapping the hole 52, with its width Y and the width X of the hole 52 satisfying the relation X≦Y.

Next, the sectional structure of a semiconductor device will be described with reference to FIGS. 2A, 2B and 2C.

First, the structure of the light shielding wall 50 will be described with reference especially to FIGS. 2A and 2B. As shown in FIG. 2B, a first interlayer insulating layer 20 and a second interlayer insulating layer 30 are sequentially set up on a semiconductor layer 10. A first metal layer 24 is set up on the first interlayer insulating layer 20, and a second metal layer 34 is set up on the second interlayer insulating layer 30. The semiconductor layer 10 and the first metal layer 24 are connected via a contact layer 22 that is set up on the first interlayer insulating layer 20. The first metal layer 24 and the second metal layer 34 are connected via a via layer 32 that is set up on the second interlayer insulating layer 30.

The contact layer 22 and the via layer 32 are formed by filling light shielding materials, such as a conductive layer, into orifices 2a and 32a that are set up respectively on the first interlayer insulating layer 20 and the second interlayer insulating layer 30. The orifices 22a and 32a are consecutive canaliform orifices that surround the semiconductor elements excluding the area corresponding to the hole 52. Thus, as shown in FIG. 2A, the contact layer 22 and the via layer 32 that are set up at different levels cover the element forming area 10A, altogether constituting a wall. Specifically, in a semiconductor device according to the first embodiment, the light shielding wall 50 is composed of a first metal layer 24, a contact layer 22, a second metal layer 34 and a via layer 32.

Next, as shown in FIG. 2C, in the area where the hole is set up, a first interlayer insulating layer 20 and a second interlayer insulating layer 30 are sequentially set up on a semiconductor layer 10, and a wiring layer 26 is set up on the first interlayer insulating layer 20.

According to a semiconductor device of the embodiment, entrance of light from the lateral direction and from the oblique direction can be reduced because a light shielding wall 50 is set up around a semiconductor element. Further, entrance of light through the hole 52 can be reduced because the pattern on the wiring layer 26 is controlled, for example, by setting up the second part 26B in a manner of covering the hole 52 when the wiring layer 26 connected to various kinds of semiconductor elements is drawn out through the hole 52 of the light shielding wall 50. As a result, the fluctuation of properties is inhibited, making it possible to provide a more reliable semiconductor device.

2. Second Embodiment

Figure 3:
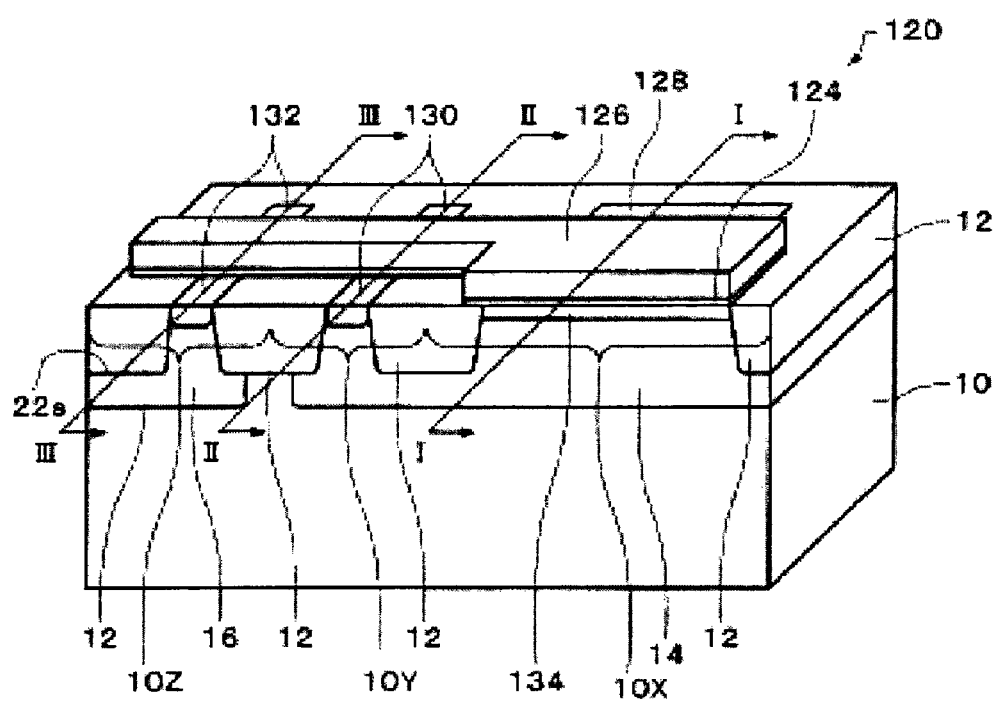
FIG. 3 is an oblique diagram showing a memory cell that is set up on a semiconductor device according to a second embodiment.
Figure 4:
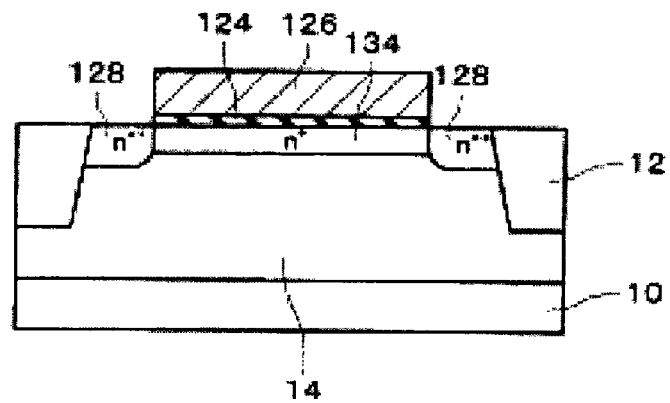
FIG. 4A is a sectional view along line I-I in FIG. 3.
FIG. 4B is a sectional view along line II-II in FIG. 3.
FIG. 4C is a sectional view along line III-III in FIG. 3.
Figure 4:
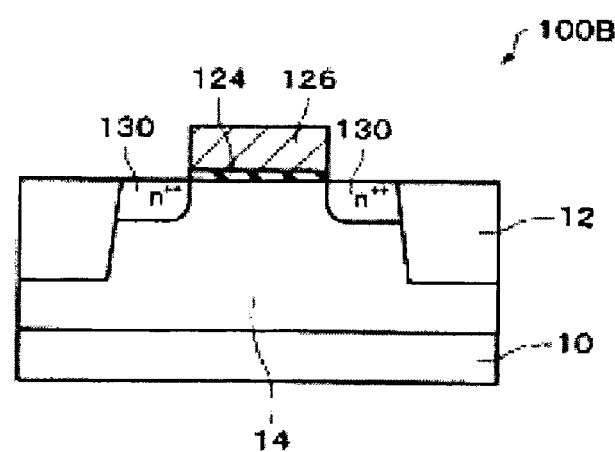
Figure 4:
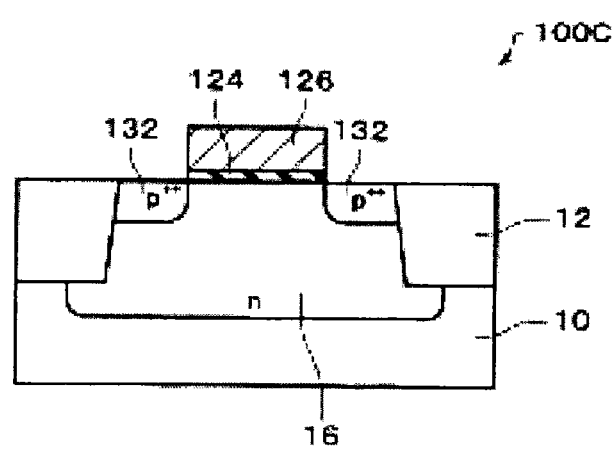
Figure 5:
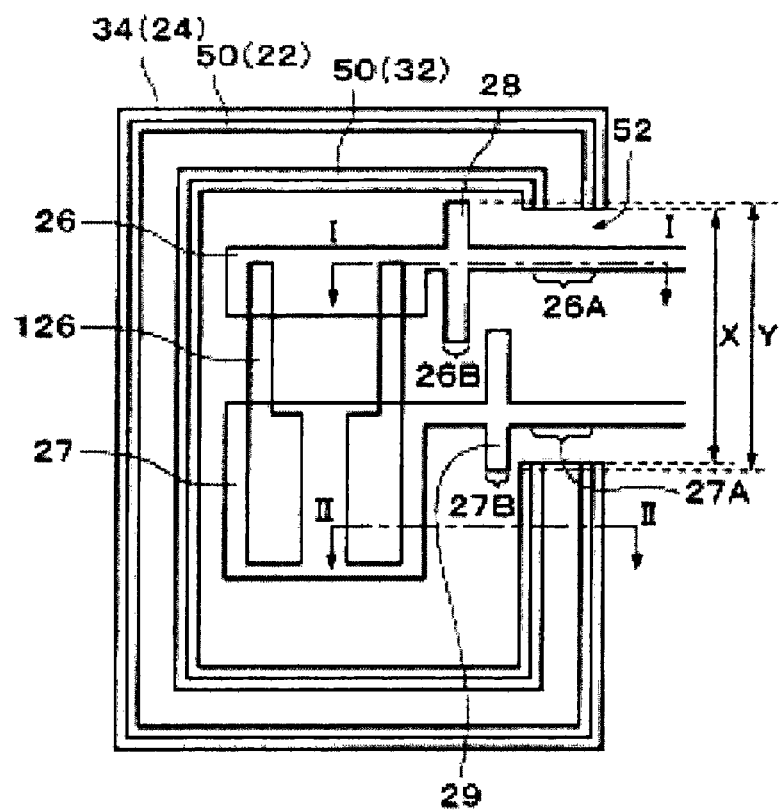
FIG. 5 is a two-dimensional pattern diagram showing a semiconductor device according to a second embodiment.

Next, a second embodiment will be described with reference to FIGS. 3 to 7. FIGS. 3 and 4 are diagrams showing a nonvolatile memory cell (hereinafter simply referred to as a "memory cell") that is set up on the element forming area 10A in the semiconductor device according to the second embodiment. FIG. 5 is a two-dimensional pattern diagram showing a semiconductor device according to the second embodiment.

FIG. 6A is a sectional view along line I-I in FIG. 5, and FIG. 6B is a sectional view along line II-II in FIG. 5. FIG. 7 is a two-dimensional diagram showing a modification example of semiconductor devices according to the second embodiment.

First, a memory cell, which is a semiconductor element set up on the element forming area 10A, will be described.

In a memory cell 120 that is included in the semiconductor device of the embodiment, a control gate is an n-type impurity area within a semiconductor layer 10, and a floating gate electrode is composed of conductive layers, such as a single-layer polysilicon layer (hereinafter also referred to as a "single-layer gate type nonvolatile storage device"). FIG. 3 is an oblique diagram showing a memory cell. FIG. 4A is a sectional view along line I-I in FIG. 3, FIG. 4B is a sectional view along line II-II in FIG. 3, and FIG. 4C is a sectional view along line III-III in FIG. 3.

As shown in FIG. 3, the memory cell 120 in the embodiment is set up on a p-type semiconductor layer 10. The semiconductor layer 10 is separately bounded into a first area 10X, a second area 10Y, and a third area 10Z by an element detachment insulating layer 12. The first area 10X and the second area 10Y are set up on a p-type well 14. The third area 10Z is set up on an n-type well 16. The first area 10X is a control gate unit, and the second area 10Y is a writing unit, and the third area 10Z is an erasing unit.

An insulating layer 124 is set up on the semiconductor layer 10 composed of the first area 10X, the second area 10Y, and the third area 10Z. On the insulating layer 124, a floating gate electrode 126 is set up covering over the first area 10X, the second area 10Y, and the third area 10Z.

The sectional structure of each area will now be described. As shown in FIG. 4A, the first area 10X includes an insulating layer 124 that is set up on a well 14, a floating gate electrode 126 that is set up on the insulating layer 124, an n-type impurity area 134 that is set up on a semiconductor layer 10 beneath a floating gate electrode 126, and an n-type impurity area 128 that is set up adjacent to the impurity area 134. The n-type impurity area 134 serves as a control gate. The impurity area 128 is electrically connected to the control gate line, constituting a contact section for applying voltage to the control gate.

As shown in FIG. 4B, an n-channel type MOS transistor 100B is set up on the second area 10Y for writing to the memory cell 120. The n-channel type transistor 100B includes an insulating layer 124 that is set up on a well 14, a floating gate electrode 126 that is set up on the insulating layer 124, and an impurity area 130 that is set up on a semiconductor layer 10. The impurity area 130 constitutes a source area or a drain area.

As shown in FIG. 4C, a p-channel type transistor 100C is set up on the third area 10Z. The p-channel type transistor 100C includes an insulating layer 124 that is set up on an n-type well 16, a floating gate electrode 126 that is set up on the insulating layer 124, and an impurity area 132 that is set up on the n-type well 16. The impurity area 132 constitutes a source area or a drain area.

Next, a semiconductor device of the embodiment will be described with reference to FIG. 5. Only the shape of a floating gate electrode 126, among the components of a memory cell 120 on an element forming area 10A, is shown in FIG. 5. As shown in FIG. 5, two memory cells 120 are set up within the element forming area 10A. A light shielding wall 50 is set up in a manner of surrounding the element forming area 10A. The light shielding wall 50 does not surround all the periphery of the element forming area 10A, but has a hole 52, just like in the first embodiment. Signal wires 26 and 27 of the memory cell 120 are drawn out to the outside of the element forming area 10A through the hole 52. The signal wire 26 is electrically connected to a p-channel type transistor 100C that is set up on the third area 10Z. The signal wire 27 is electrically connected to an impurity area 128 on the first area 10X. In the semiconductor device shown in FIG. 5, the signal wires 26 and 27 are drawn out through the same hole 52 in the same direction.

The signal wire 26 has a pattern including a first part 26A that is located within the hole 52 and a second part 26B that is located in the inside of the hole 52 and has a larger width compared to the width of the first part 26A. Similarly, the signal wire 27 also has a pattern including a first part 27A and a second part 27B that is located on the outside of the hole 52 and has a larger width compared to the width of the first part 27A. Further, the signal wires 26 and 27 are patterned so that the total width Y of the second parts 26B and 27B may overlap the width of the hole 52. In the embodiment, the second parts 26B and 27B are set up on the adjacent side of the element forming area 10A and within the outside area of the hole 52. The signal wires 26 and 27 have a pattern in which the width of the signal wires 26 and 27 becomes locally larger by setting up the branching sections 28 and 29, just like in the first embodiment. In this way, by setting up the branching sections 28 and 29, the total width of the second parts 26B and 27B can be made larger compared to the width X of the hole 52.

Next, a sectional shape of a semiconductor device according to the second embodiment will be described with reference to FIGS. 6A and 6B.

Figure 6:
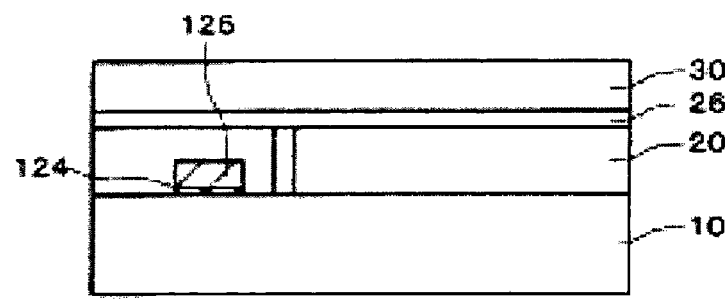
FIG. 6A is a sectional view along line I-I in FIG. 5.
FIG. 6B is a sectional view along line II-II in FIG. 5.
Figure 6:
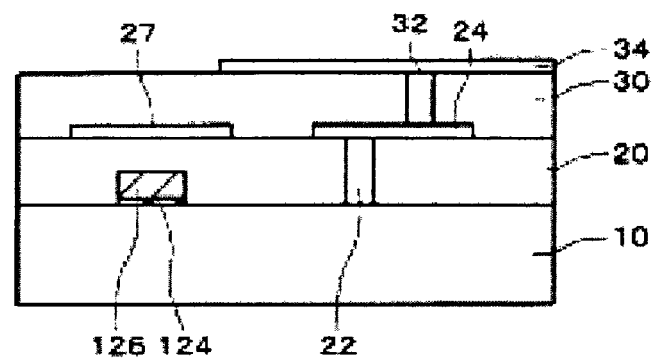
Figure 7:
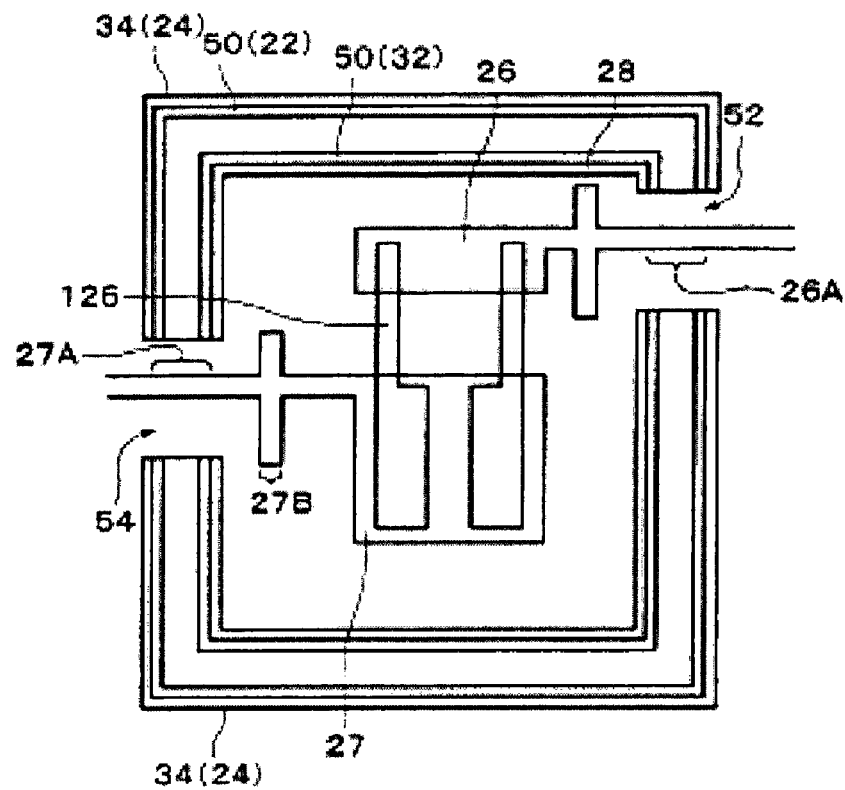
FIG. 7 is a two-dimensional diagram showing a semiconductor device according to a modification example of a second embodiment.

As shown in FIG. 6, a memory cell 120 is set up on a semiconductor layer on an element forming area 10A in a semiconductor device 200. Refer to the above explanation as for the concrete structure of the memory cell 120.

As shown in FIGS. 6A and 6B, a first interlayer insulating layer 20 and a second interlayer insulating layer 30 are sequentially set up on a semiconductor layer 10 in a manner of covering a memory cell 120. As shown in FIG. 6A, a signal wire 26 is set up on the first interlayer insulating layer 20 within the area that constitutes a hole 52, or the area where a light shielding wall 50 (refer to FIG. 5) is not set up. The signal wire 26 is electrically connected to a p-channel transistor 100C in the third area 10Z on the memory cell 120.

Further, as shown in FIG. 6B, on the area that constitutes the light shielding wall 50, a first metal layer 24 is set up on the first interlayer insulating layer 20 and a second metal layer 34 is set up on the second interlayer insulating layer 30. A contact layer 22 is set up between the semiconductor layer 10 and the first metal layer 24, and a via layer 32 is set up between the first metal layer 24 and the second metal layer 34. The contact layer 22 and the via layer 32 are formed by setting up orifices 22a and 32a on the first interlayer insulating layer 20 and the second interlayer insulating layer 30, and filling a conductive layer into the orifices 22a and 32a. The orifices 22a and 32a are canaliform orifices that are formed in a manner of surrounding the element forming area 10A. Thus, the contact layer 22 and the via layer 32 altogether constitute a wall, surrounding the element forming area 10A.

According to a semiconductor device of the second embodiment, entrance of light from the lateral direction and from the downward oblique direction can be reduced because a light shielding wall 50 is set up around a memory cell 120. Further, when the wiring layers 26 and 27 connected to the memory cell 120 are drawn out through the hole 52 of the light shielding wall 50, entrance of light through the hole 52 can be reduced by making the widths of the signal wires 26 and 27 locally larger, for example, by setting up the second parts 26B and 27B. As a result, the charge conserving property can be improved, making it possible to provide a more reliable semiconductor device.

Modification example

Next, a semiconductor device according to a modification example of the second embodiment will be described with reference to FIG. 7. FIG. 7 is a two-dimensional diagram showing a semiconductor device according to a modification example of the second embodiment, showing a plane surface corresponding to FIG. 5.

In a semiconductor device according to the modification example, the directions in which the signal wires 26 and 27 are drawn out are different from each other, as shown in FIG. 7. Specifically, the holes 52 and 54, or the part where the light shielding wall 50 is not set up, are respectively set up on different edges of the element forming area 10A. The signal wire 26 is drawn out through the hole 52 and the signal wire 27 is drawn out through the hole 54. The signal wires 26 and 27 respectively include a pattern that includes second parts 26B or 27B the widths of which are larger than the widths of the holes 52 and 54. Thus, entrance of light from the lateral direction and from the oblique direction can be reduced, making it possible to provide a semiconductor device the charge conserving property of which is improved.

3. Third Embodiment

Figure 8:
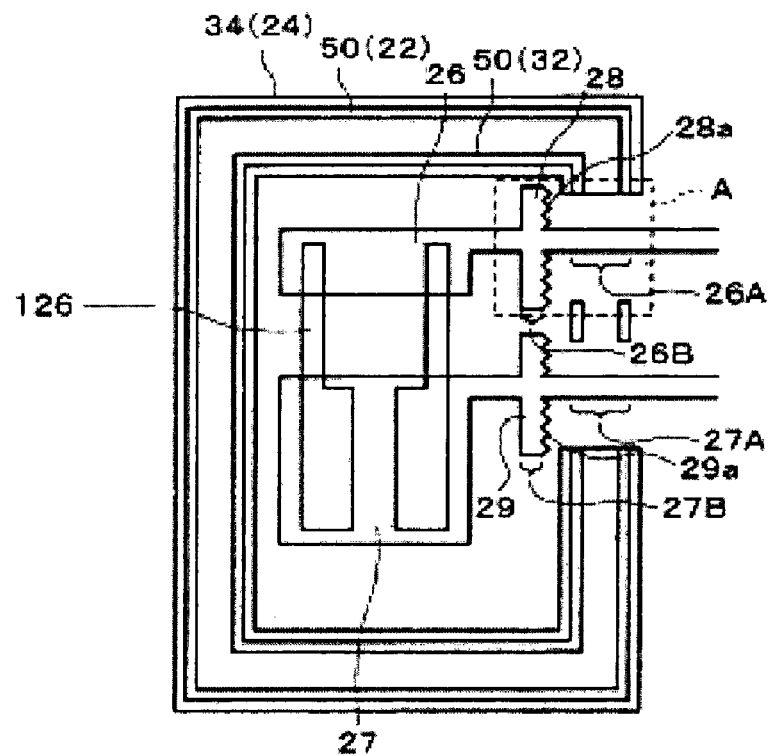
FIG. 8 is a two-dimensional diagram showing a semiconductor device according to a third embodiment.
Figure 9:
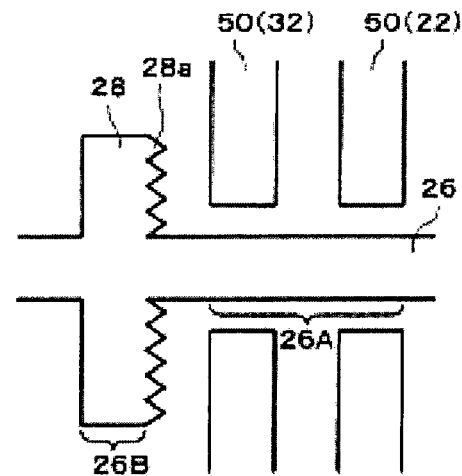
FIG. 9 is an enlarged two-dimensional diagram showing part A in FIG. 8.

Next, a semiconductor device according to a third embodiment will be described with reference to FIGS. 8 and 9. FIG. 8 is a two-dimensional pattern diagram showing a semiconductor device according to the third embodiment, showing a plane surface corresponding to FIG. 5. FIG. 9 is an enlarged two-dimensional diagram showing part A in FIG. 8. As shown in FIG. 8, a semiconductor device according to the third embodiment has a second part 26B the shape of which is different from the semiconductor device of the above-mentioned embodiment. In the following explanation, detailed descriptions will not be given for structures that are common to the above-mentioned embodiment.

As shown in FIG. 8, a memory cell 120 is set up on the element forming area 10A. The periphery of the element forming area 10A is covered by a light shielding wall 50. The signal wires 26 and 27 that are electrically connected to the memory cell 120 are drawn out to the outside of the light shielding wall 50 through the hole 52 where the light shielding wall 50 is not set up. The signal wires 26 and 27 have branching sections 28 and 29 on the outside of the hole 52. As shown in FIG. 9, a semiconductor device according to the third embodiment has convex parts 28a and 29a on the side surfaces of the branching sections 28 and 29 that face the direction in which light enters. There is no limit of the shape of the convex parts 28a and 29a, as long as the side surfaces of the branching sections 28 and 29 can be made uneven. Thus, it is also acceptable if the edge of the convex parts is, for example, curved. One of preferable shapes for the convex parts 28a and 29a is an acute shape composed of a plurality of inclined planes. In FIGS. 8 and 9, a case in which acute shape convex parts 28a and 29a having two inclined planes are set up in a line is shown.

According to a semiconductor device of the third embodiment, the side surface that faces the entering direction of light (or the side surface of the branching sections 28 and 29) have the convex parts 28a and 29a on its surface, on the second parts 26B and 27B that are located on the outside of the hole 52. Thus, regardless of the sizes of the incident angle of light that enters into the hole 52, the light can be reflected and entrance of light can be further reduced. As a result, the fluctuation of properties is inhibited and a more reliable semiconductor device can be provided. Further, in the case where the shapes of the convex parts 28a and 29a are acute, the light that enters into the hole 52 from the oblique direction can be easily reflected.

4. Fourth Embodiment

Figure 10:
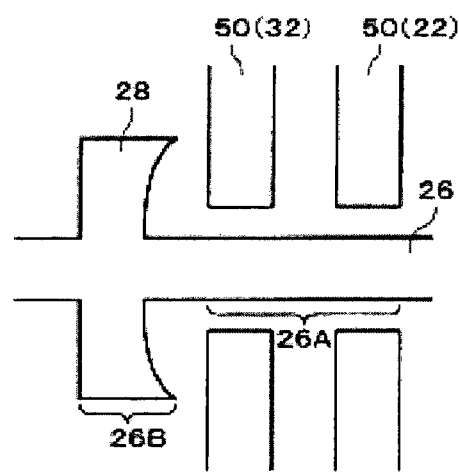
FIG. 10 is a two-dimensional diagram showing a semiconductor device according to a fourth embodiment.

FIG. 10 is a two-dimensional diagram showing a semiconductor device according to a fourth embodiment, showing a plane surface corresponding to FIG. 9. As shown in FIG. 10, a semiconductor device according to the fourth embodiment has a second part the shape of which is different from that of the semiconductor devices according to the above-embodiments. In the following explanation, detailed descriptions will not be given for structures that are common to the above-mentioned embodiments.

As shown in FIG. 10, on a semiconductor device according to the fourth embodiment, the second part 26B has a concaved shape that faces toward the entering direction of light. Specifically, the second part 26B includes a branching section 28, the shape of which is formed in a manner that the length Z gets larger as the distance from the signal wire 26, which is an axis, increases, in other words toward the edges of the branching section 28. Thus, the entire shape of the second part 26B has a concaved surface that faces toward the entering direction of light.

A semiconductor device according to the fourth embodiment has the same advantages with the other above-mentioned embodiments, and entrance of light from the lateral direction and from the downward oblique direction can be reduced. Further, the second part 26B has a concaved curved surface that faces toward the entering direction of light. Thus, even if the light that enters from the downward oblique direction into the hole 52 can be reflected, reducing further the entrance of light. As a result, the fluctuation of properties is inhibited and a more reliable semiconductor device can be provided.

5. Fifth Embodiment

Figure 11:
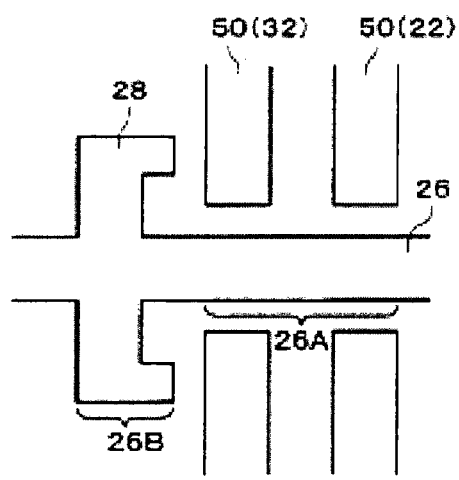
FIG. 11 is a two-dimensional diagram showing a semiconductor device according to a fifth embodiment.

FIG. 11 is a two-dimensional pattern diagram showing a semiconductor device according to a fifth embodiment, showing a plane surface corresponding to FIG. 9. As shown in FIG. 11, a semiconductor device according to the fifth embodiment has a second part the shape of which is different from the semiconductor devices according to the above-mentioned embodiments. In the following explanation, detailed descriptions will not be given for structures that are common to the above-mentioned embodiments.

As shown in FIG. 11, in a semiconductor device according to the fifth embodiment, the second part 26B has a concaved shape that faces toward the entering direction of light. For example, as shown in FIG. 11, the entire shape of the second part 26B can be made concaved by making the shape of the branching sections 28 and 29 L-shape.

A semiconductor device according to the fifth embodiment has the same advantages with the other above-mentioned embodiments, and entrance of light from the lateral direction and from downward oblique direction can be reduced.

The invention is not limited to the above-mentioned embodiments, and any modification is acceptable as far as the purpose of the invention is not altered. For example, although the case in which two layers, a first interlayer insulating layer 20 and a second interlayer insulating layer 30, are set up on a semiconductor element is shown in the embodiments, it is not limited to this configuration, and more than or equal to three layers of interlayer insulating layer can be also set up. In this case, a via layer that is set up in the position surrounding an element forming area constitutes a light shielding wall on each of the interlayer insulating layers.

Further, although the case in which the positions of the via layer 32 and the contact layer 22 constituting the light shielding wall 50 may not overlap is shown in the embodiments, it is not limited to this configuration, and the layers can overlap. Further, the light shielding wall 50 can be formed by setting up, instead of the contact layer 22 and the via layer 32, an orifice that passes through the first interlayer insulating layer 20 and the second interlayer insulating layer 30 and filling a conductive material into the orifice.

Further, although the signal wires 26 and 27 are drawn through a hole 52 in FIG. 5, it is not limited to this configuration, and it is also applicable to set up a hole respectively for each of the signal wires 26 and 27.

Moreover, although the case in which a light shielding film is set up to cover the upward part of the element forming area 10A is not particularly shown in the semiconductor device according to the above-mentioned embodiments, it goes without saying that it is preferable to set up a light shielding film over the element forming area 10A. Thus, entrance of light from the downward direction and from the lateral direction can be reduced, making it possible to provide a more reliable semiconductor device.

The entire disclosure of Japanese Patent Application No. 2004-369587, filed Dec. 12, 2004 is expressly incorporated by reference herein.

What is claimed is:

1. A semiconductor device, comprising:
a semiconductor layer, the semiconductor layer including a first semiconductor element and a second semiconductor element;
a light shielding wall formed around the first semiconductor element and the second semiconductor element, the light shielding wall including a opening;
a first wiring layer which is electrically connected to at least the first semiconductor element through the opening, the first wiring layer including a first portion which is formed in an inside of the light shielding wall and a second portion which is formed in an outside of the light shielding wall, a first width of the first portion of the first wiring layer being larger than a second width of the second portion of the first wiring layer in a planar view; and
a second wiring layer which is electrically connected to at least the second semiconductor element through the opening, the second wiring layer including a third portion which is formed in the inside of the light shielding wall and a fourth portion which is formed in the outside of the light shielding wall, a third width of the third portion of the second wiring layer being larger than a fourth width of the fourth portion of the second wiring layer in the planar view.

2. A semiconductor device, comprising:
a semiconductor layer, the semiconductor layer including a first semiconductor element and a second semiconductor element;
a first metal layer formed around the first semiconductor element and the second semiconductor element, the first metal layer including a opening;
a first wiring layer which is electrically connected to the first semiconductor element through the opening, the first wiring layer including a first portion which is formed in an inside of the first metal layer and a second portion which is formed in an outside of the first metal layer, a first width of the first portion of the first wiring layer being larger than a second width of the second portion of the first wiring layer in a planar view; and
a second wiring layer which is electrically connected to the second semiconductor element through the opening, the second wiring layer including a third portion which is formed in the inside of the first metal layer and a fourth portion which is formed in the outside of the first metal layer, a third width of the third portion of the second wiring layer being larger than a fourth width of the fourth portion of the second wiring layer in the planar view.

3. A semiconductor device, according to claim 1,
a fifth width which is a total width of the first width and the third width being lager than a sixth width of the opening in the planar view.

4. A semiconductor device, according to claim 1,
the first portion being overlapped with the third portion in viewing from a direction to which the first wiring layer or the second wiring layer extends.

5. A semiconductor device, according to claim 1,
the first wiring layer including a fifth portion, the fifth portion being contact with at least the first semiconductor element, the fifth portion being different from the first portion; and
the second wiring layer including a sixth portion, the sixth portion being contact with at least the second semiconductor element, the sixth portion being different from the third portion.

6. A semiconductor device, according to claim 1,
the first portion of the first wiring layer including at least one first convex; and
the third portion of the second wiring layer including at least one second convex.

7. A semiconductor device, according to claim 6,
the at least one first convex and the at least one second convex facing toward the opening.

8. A semiconductor device, according to claim 6,
the at least one first convex including a first triangle;
the at least one second convex including a second triangle.

9. A semiconductor device, according to claim 1,
the first portion of the first wiring layer including at least one first concavity; and
the third portion of the second wiring layer including at least one second concavity.

10. A semiconductor device, according to claim 9,
the at least one first concavity and the at least one second concavity facing toward the opening.

11. A semiconductor device, according to claim 1,
the first portion of the first wiring layer including at least one first curved shape; and
the third portion of the second wiring layer including at least one second curved shape.

12. A semiconductor device, according to claim 11,
the at least one first curved shape and the at least one second curved shape facing toward the opening.

13. A semiconductor device, according to claim 1,
the first semiconductor element and the second semiconductor element having a property which changes in response to a light.

14. A semiconductor device, according to claim 1,
the first semiconductor element being a first transistor or a first memory; and
the second semiconductor element being a second transistor or a second memory.

15. A semiconductor device, according to claim 14,
the first memory having a first gate electrode layer, the first gate electrode being single; and
the second memory having a second gate electrode layer, the second gate electrode being single.

16. A semiconductor device, according to claim 1, further including,
a light shielding layer formed above the first semiconductor element and the second semiconductor element, the light shielding layer covering the first semiconductor element and the second semiconductor element.

17. A semiconductor device, according to claim 16,
the light shielding wall including a first conductive material; and
the light shielding layer including a second conductive material.

18. A semiconductor device, according to claim 17,
the first metal layer including a first conductive material; and
the second metal layer including a second conductive material.

19. A semiconductor device, according to claim 1,
the light shielding wall being formed continually from one edge of the opening to another edge of the opening.

20. A semiconductor device, according to claim 2,
a fifth width which is a total width of the first width and the third width being lager than a sixth width of the opening in the planar view.

21. A semiconductor device, according to claim 2,
the first portion being overlapped with the third portion in viewing from a direction to which the first wiring layer or the second wiring layer extends.

22. A semiconductor device, according to claim 2,
the first wiring layer including a fifth portion, the fifth portion being contact with at least the first semiconductor element, the fifth portion being different from the first portion; and
the second wiring layer including a sixth portion, the sixth portion being contact with at least the second semiconductor element, the sixth portion being different from the third portion.

23. A semiconductor device, according to claim 2,
the first portion of the first wiring layer including at least one first convex; and
the third portion of the second wiring layer including at least one second convex.

24. A semiconductor device, according to claim 23,
the at least one first convex and the at least one second convex facing toward the opening.

25. A semiconductor device, according to claim 23,
the at least one first convex including a first triangle;
the at least one second convex including a second triangle.

26. A semiconductor device, according to claim 2,
the first portion of the first wiring layer including at least one first concavity; and
the third portion of the second wiring layer including at least one second concavity.

27. A semiconductor device, according to claim 26,
the at least one first concavity and the at least one second concavity facing toward the opening.

28. A semiconductor device, according to claim 2,
the first portion of the first wiring layer including at least one first curved shape; and
the third portion of the second wiring layer including at least one second curved shape.

29. A semiconductor device, according to claim 28,
the at least one first curved shape and the at least one second curved shape facing toward the opening.

30. A semiconductor device, according to claim 2,
the first semiconductor element and the second semiconductor element having a property which changes in response to a light.

31. A semiconductor device, according to claim 2,
the first semiconductor element being a first transistor or a first memory; and
the second semiconductor element being a second transistor or a second memory.

32. A semiconductor device, according to claim 31,
the first memory having a first gate electrode layer, the first gate electrode being single; and
the second memory having a second gate electrode layer, the second gate electrode being single.

33. A semiconductor device, according to claim 2, further including,
a second metal layer formed above the first semiconductor element and the second semiconductor element, the second metal layer covering the first semiconductor element and the second semiconductor element.

34. A semiconductor device, according to claim 33,
the first metal layer and the second metal layer having a function of a light shielding.

35. A semiconductor device, according to claim 2,
the first metal layer being formed continually from one edge of the opening to another edge of the opening.

* * * * *